US010418326B2

United States Patent
Jung et al.

(10) Patent No.: US 10,418,326 B2
(45) Date of Patent: Sep. 17, 2019

(54) SEMICONDUCTOR DEVICE AND METHOD OF FABRICATING THE SAME

(71) Applicant: Samsung Electronics Co., Ltd., Suwon-si (KR)

(72) Inventors: Eun Ji Jung, Hwaseong-si (KR); Rak Hwan Kim, Suwon-si (KR); Byung Hee Kim, Seoul (KR); Young Hun Kim, Yongin-si (KR); Gyeong Yun Han, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/833,041

(22) Filed: Dec. 6, 2017

(65) Prior Publication Data

US 2018/0158781 A1 Jun. 7, 2018

(30) Foreign Application Priority Data

Dec. 6, 2016 (KR) .......................... 10-2016-0165006

(51) Int. Cl.
*H01L 23/532* (2006.01)
*H01L 21/768* (2006.01)
*H01L 23/528* (2006.01)

(52) U.S. Cl.
CPC .. *H01L 23/53238* (2013.01); *H01L 21/76846* (2013.01); *H01L 21/76873* (2013.01); *H01L 23/5283* (2013.01)

(58) Field of Classification Search
CPC ........... H01L 23/5226; H01L 23/53238; H01L 23/53283
See application file for complete search history.

(56) References Cited

U.S. PATENT DOCUMENTS

| 6,551,872 B1* | 4/2003 | Cunningham ...... H01L 23/5226 |
| | | 257/751 |
| 9,330,939 B2 | 5/2016 | Zope et al. |
| 9,349,637 B2 | 5/2016 | Na et al. |
| 9,362,167 B2 | 6/2016 | Shimada et al. |
| 9,799,555 B1* | 10/2017 | Zhang ............... H01L 23/53228 |
| 2004/0082167 A1 | 4/2004 | Seo et al. |
| 2008/0111239 A1* | 5/2008 | Yang ................... H01L 23/5283 |
| | | 257/751 |
| 2017/0338148 A1* | 11/2017 | Shusterman ...... H01L 23/53223 |

FOREIGN PATENT DOCUMENTS

| KR | 1999-0026626 | 9/1997 |
| KR | 2001-0107101 | 12/2001 |
| KR | 2003-0090872 | 12/2003 |
| KR | 1069630 | 10/2011 |
| KR | 2011-0123634 | 11/2011 |
| KR | 1141214 | 5/2012 |

* cited by examiner

Primary Examiner — Cuong Q Nguyen
(74) Attorney, Agent, or Firm — Muir Patent Law, PLLC

(57) ABSTRACT

A semiconductor device and a method of fabricating the same are provided. The semiconductor device includes an interlayer insulating film on a substrate, the interlayer insulating film including an opening, a barrier conductive film extending along a sidewall of the opening and a bottom surface exposed by the opening, a first film disposed on the barrier conductive film and in the opening, and the first film including cobalt, and a conductive liner on the barrier conductive film, the conductive liner extending along a portion of a side all of the opening and including a metal other than cobalt.

21 Claims, 15 Drawing Sheets

SEMICONDUCTOR DEVICE AND METHOD OF FABRICATING THE SAME

CROSS-REFERENCE TO RELATED APPLICATION

This application claims priority under 35 U.S.C. § 119 to Korean Patent Application No. 10-2016-0165006, filed on Dec. 6, 2016 in the Korean Intellectual Property Office, the disclosure of which is incorporated by reference herein in its entirety.

BACKGROUND

1. Technical Field

The present disclosure relates to a semiconductor device and a method of fabricating the same.

2. Description of the Related Art

As down-scaling of semiconductor devices accelerates with the development of the electronic technology, high-integration and low-power consumption of semiconductor chips are demanded.

In response to the demand of high-integration and low-power consumption of semiconductor devices, it is helpful to enhance low resistance and electromigration tolerance of wires in the semiconductor device.

To meet these demands, a copper having high conductivity and excellent tolerance to the electromigration is used as a wire material.

SUMMARY

An object of the present disclosure is to provide a semiconductor device improving performance and/or reliability of the semiconductor device, by using a wire including a cobalt film.

Another object of the present disclosure is to provide a method for fabricating a semiconductor device which improves performance and/or reliability of the semiconductor device, by using a wire including a cobalt film formed with an electroplating method.

The objects according to the present disclosure are not limited to those set forth above and objects other than those set forth above will be clearly understood to a person skilled in the art from the following description.

According to an exemplary embodiment of the disclosure, a semiconductor device includes an interlayer insulating film on a substrate, the interlayer insulating film including an opening, a barrier conductive film extending along a sidewall of the opening and a bottom surface exposed by the opening, a first film disposed on the barrier conductive film and in the opening, and the first film including cobalt, and a conductive liner on the barrier conductive film, the conductive liner extending along a portion of a sidewall of the opening and including a first metal other than cobalt.

According to another exemplary embodiment of the disclosure, a semiconductor device includes an interlayer insulating film on a substrate, the interlayer insulating film including an opening, wherein the opening includes a lower portion and an upper portion, a filling film including a first portion filling a lower portion of the opening and a second portion filling an upper portion of the opening, wherein the filling film includes cobalt, and a metal separating region within the filling film, the metal separating region including a first metal other than cobalt, wherein the metal separating region is disposed on the second portion of the filling film and is not disposed on the first portion of the filling film.

According to still another exemplary embodiment of the disclosure, a semiconductor device includes in interlayer insulating film on a substrate, the interlayer insulating film including a first opening and a second opening having different widths from each other: a first filling film filling the first opening and including a first metal, wherein the first metal is cobalt, a second filling film filling the second opening and including the first metal, a first conductive liner within the first filling film, the first conductive liner including a second metal different from the first metal, and a second conductive liner within the second filling film, the second conductive liner including the second metal, wherein a vertical distance from an upper surface of the interlayer insulating film to a lower surface of the first conductive liner is different from a vertical distance from an upper surface of the interlayer insulating film to a lower surface of the second conductive liner.

According to still another exemplary embodiment of the disclosure, a method of fabricating a semiconductor device includes forming an interlayer insulating film including an opening on a substrate, wherein the opening includes an upper portion and a lower portion, forming a cobalt seed film along a sidewall of the opening and a bottom surface exposed by the opening and an upper surface of the interlayer insulating film, performing a surface treatment on the cobalt seed film on a sidewall of the upper portion of the opening and the upper surface of the interlayer insulating film, after the surface treatment, forming a lower cobalt film filling the lower portion of the opening by using a first electroplating method, and forming an upper cobalt film filling the upper portion of the opening on the lower cobalt film by using a second electroplating method different from the first electroplating method.

According to certain embodiments of the disclosure, a semiconductor device includes an insulation film formed on a substrate, a first opening formed in the insulation film, a first cobalt layer formed in the first opening, and a first metal region formed in an upper side portion of the first cobalt layer in a cross-sectional view the first metal region comprising a first metal other than cobalt.

According to certain embodiments of the disclosure, a method of manufacturing a semiconductor device includes steps of forming a first insulation layer on a substrate, forming a first opening in the first insulation layer, forming a first cobalt layer on the first insulation layer and in the first opening, forming a first metal layer on the first cobalt layer to expose the first cobalt layer at a lower portion of the first opening, filling the lower portion of the first opening with a second cobalt layer, forming a third cobalt layer on the first metal layer to fill an upper, portion of the first opening, and performing a planarization process removing respective upper portions of the first metal layer, the first cobalt layer, and the third cobalt layer to expose an upper portion of the first insulation layer.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings.

DETAILED DESCRIPTION

Figure 1:
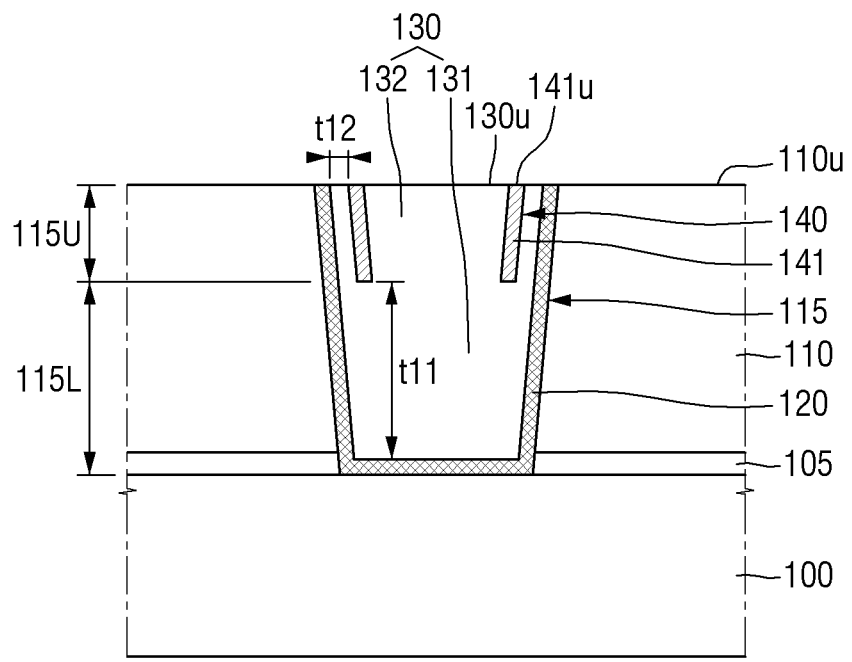
FIG. 1 is a cross-sectional view provided to explain a semiconductor device according to some exemplary embodiments of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that examples and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g., "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or, may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" "coupled to" or "on" another element, it can be directly connected/coupled to/on the other element or in averting elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated far clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Although above described drawings illustrate a wire formed in a back end of line (BEOL) process of a semiconductor device according to some exemplary embodiments of the present disclosure, exemplary embodiments are not hunted thereto. In certain embodiments, certain features, e.g., wire structure, methods of fabricating a wire structure etc., of the exemplary embodiments illustrated in the drawings may be also applicable to fabrication of a metal gate electrode and formation of contacts in a front end of line (FEOL) process.

Hereinbelow, a semiconductor device according to some exemplary embodiments will be described with reference to FIG. 1.

FIG. 1 is a cross-sectional view provided to explain a semiconductor device according to some exemplary embodiments. As used herein, a semiconductor device may refer to any of the various devices such as shown in FIGS. 1-6 and 8, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

Referring to FIG. 1, the semiconductor device according to sortie exemplary embodiments may include an interlayer insulating film 110, a first barrier conductive film 120, a first filling film 130, and a first metal separating region 140.

The interlayer insulating film 110 may be formed on a substrate 100. The interlayer insulating, film 110 may include a first trench 115 formed within the interlayer insulating film 110. Trenches and structures inside the trenches are described in various embodiments of the present disclosure including the first trench 115, and the trenches and the inside structures are illustrated in various figures of the present application with cross-sectional views. However, the structures inside the trenches of the present disclosure may also be applied to inside structures of openings and/or holes, e.g., contact holes and other types of holes that have substantially the same cross-sectional views as the ones of the trenches in the present disclosure. Therefore, present disclosure encompasses inside structures of openings and/or holes including contact holes and other types of holes/openings when the present disclosure describes inside structures of trenches. For example, in a plan view, the openings holes may have circular shapes, square shapes, rectangular shapes etc. The contact holes may be filled with electrical contact structures therein, e.g., contact plugs. For example, an inside structure of an opening/hole may be a structure of contact plug when the opening/hole is a contact hole.

The substrate 100 may have a structure in which a base substrate and an epitaxial layer are stacked, but not limited thereto. The substrate 100 may be a silicon substrate, a gallium arsenide substrate, a silicon germanium substrate, a ceramic substrate, a quartz substrate, a glass substrate (e.g., for a display), or a semiconductor on insulator (SOI) substrate.

Hereinbelow, a silicon substrate will be described as an example. For example, the substrate 100 may have a configuration in which the insulating film is formed on the silicon substrate.

In certain embodiments, although not illustrated, the substrate 100 may include a conductive pattern. The conductive pattern may be a metal ire, a contact, a gate electrode of a transistor, a source of, a transistor, or a diode, but not limited thereto.

An etch stopping film 105 may be formed between the substrate 100 and the interlayer insulating film 110. The etch stopping film 105 may include, for example, at least one of silicon nitride (SiN), oxynitride (SiON), and silicon carbonitride (SiCN). The etch stopping film may be formed by using, for example, the vapor deposition (CVD), atomic layer deposition (ALD), and so on.

The interlayer insulating film 110 may include, for example, at least one of silicon oxide, silicon nitride, silicon oxynitride, and a low-k dielectric material.

For example, the interlayer insulating film 110 may include a low-k dielectric material to alleviate the coupling phenomenon between wires. The low-k dielectric material may be silicon oxide having suitably high carbon and hydrogen, for example, and may be a material such as SiCOH.

For example, a dielectric constant of an insulating material may be lowered by an addition of carbon into the insulating material. Alternatively, or in addition to adding carbon, in order to further lower a dielectric constant of the insulating material, the insulating material may include, within the insulating material, pores and/or cavities filled with gases or air.

For example, the low-k dielectric material may include flowable oxide (FOX), undoped silica glass (USG), borosilica glass (BSG), phosphosilica glass (PSG), borophosphosilica glass (BPSG), plasma enhanced tetra ethyl ortho silicate (PETEOS), fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), Tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but not limited thereto.

The first trench 115 within the interlayer insulating film 110 may include an upper portion 115U and a lower portion 115L. It will be described below as to how the upper portion 115U of the first trench 115 and the lower portion 115L of the first trench 115 are defined.

The first barrier conductive film 120 may be formed along a sidewall and a bottom surface of the first trench 115. The first barrier conductive film 120 may prevent elements included in the first filling film 130 from being diffused into the interlayer insulating film 110, the substrate 100 and/or the etch stopping film 105.

The first barrier conductive film 120 may include, for example, one a titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and a combination thereof.

Although FIG. 1 illustrates that the first barrier conductive film 120 is a single-layered film, this is only for convenience of explanation, and exemplary embodiments are not limited thereto. For example, the first barrier conductive film 120 may be formed of a plurality of layers.

Although FIG. 1 illustrates that the first barrier conductive film 120 is formed conformally along a sidewall and a bottom surface of the first trench 115, this is only for convenience of explanation and exemplary embodiments are not limited thereto.

The first filling film 130 may be formed within the first trench 115. For example, the first filling film 130 may fill the first trench 115. The first filling film 130 may fill the upper portion 115U of the first trench 115 and the lower portion 115L of the first trench 115.

The first film 130 may be formed on the first barrier conductive film 120. The first filling film 130 may be electrically connected to, a conductive pattern that may be is in the substrate 100.

The first filling film 130 may include a first metal. For example, the first metal may be cobalt. For example, the first filling film 130 may be a conductive film including cobalt.

According to some exemplary embodiments, the first filling film 130 a cobalt film.

Although FIG. 1 illustrates that an upper surface 130u of the first filling film is placed flush with an upper surface 110u of the interlayer insulating film 110, this is only for convenience of explanation, and exemplary embodiments are not limited thereto. For example, the upper surface 130u of the first filling film may be upwardly convex or downwardly concave with respect to the upper surface 110u of the interlayer insulating film 110.

The first filling film 130 way include a first lower filling film 131 the lower portion 115L of the first trench 115, and a first upper filling, film 132 filling the upper portion 115U of the first trench 115. It is described below as to how the first lower filling film 131 and the first upper film 132 are defined.

The first metal separating region 140 may be formed within the first filling film 130. The first metal separating region 140 may be formed on the first barrier conductive film 120. For example, the first metal separating region 140 may be spaced apart from the first barrier conductive film 120 in a cross-sectional view as shown in FIG. 1. In certain embodiments, the first metal separating region 140 may contact the first barrier conductive film 120.

The first metal separating region 140 may include a second metal different from the first metal included in the first filling film 130. For example, the first metal separating region 140 may include a metal different from cobalt. The first metal separating region 140 may be a conductive region.

The first metal separating region 140 may include a first conductive liner 141. For example, the first metal separating region 140 may have a bar-like shape elongated in one direction, e.g., in a cross-sectional view as shown in FIG. 1.

The first conductive liner 141 may extend along a portion of a sidewall of the first trench 115, e.g., in a cross-sectional view as shown in FIG. 1. For example, the first conductive liner 141 may extend along a sidewall of the upper portion 115U of the first trench, and may not extend along a sidewall of the lower portion 115L of the first trench, e.g., in a cross-sectional view. For example, the first conductive liner 141 may extend parallel to a portion of a side wall of the first trench 115 in a cross-sectional view, and the first conductive liner 141 may be spaced apart from the side wan of the first trench 115.

The first conductive liner 141 may be formed along the first hairier conductive film 120 formed on a sidewall of the first trench 115. The first conductive liner 141 may be formed on the first barrier conductive film 120 formed on a sidewall of the first trench 115. For example, the first conductive liner 141 may extend parallel to the first barrier conductive film 120 in a cross-sectional view. For example, the first conductive liner 141 may be spaced apart from the first barrier conductive film 120 in a cross-sectional view. In certain embodiments, the first conductive liner 141 may contact the first barrier conductive film 120.

For example, the upper portion 115U of the first trench 115 and the lower portion 115L of the first trench 115 may be defined based on whether the first trench 115 overlaps with the first conductive liner 141 or the first metal separating region 140 in a horizontal direction. For example, in this example, the first metal separating region 140 is substantially the same region that the first conductive liner 141 occupies. Therefore, the upper portion 115U of the first trench 115 may be defined by a portion of the first trench 115 overlapping with the first conductive liner 141 in a horizontal, direction, and the lower portion 115L of the first trench 115 may be defined by a portion of the first trench 115 which does not overlap with the first conductive liner 141 in a horizontal direction. A vertical direction herein indicates a normal line direction to the substrate 100, and a horizontal direction herein indicates a direction orthogonal to the vertical direction, i.e., a direction parallel to an upper surface of the substrate 100.

For example, the first metal separating region 140 may be disposed within the first upper filling film 132 that is filling, the upper portion 115U of the first trench, and may not be disposed within the first lower filling film 131 that is fining the lower portion 115L of the first trench. For example, when defining the first lower filling film 131 and the first upper filling film 132, the reference may be a bottom surface of the first metal separating region 140.

For example, comparing with a lower surface of the first conductive liner 141, a portion of the first filling film 130 closer to the substrate 100 than the lower surface of the first conductive liner 141 is the first lower filling film 131. The first upper filling film 132 may be a portion of the first filling film 130 surrounding a sidewall of the first conductive liner 141, or overlapping with the first conductive liner 141 in a horizontal direction. For example, a portion of the first filling film 130 positioned above a lower surface of the first conductive liner 141 may be the first upper filling film 132.

According to some exemplary embodiments, a portion of the first filling film 130 may be interposed, on a sidewall of the first trench 115, between the first conductive liner 141 and the first barrier conductive film 120. For example, on a sidewall of the first trench 115, a portion of the first upper filling film 132 may be interposed between the first conductive liner 141 and the first barrier conductive film 120.

For example, the first barrier conductive film 120 formed on a sidewall of the first trench 115 may be spaced from the first conductive liner 141. For example, the first barrier conductive film 120 may be spaced apart from the first conductive liner 141 in a cross-sectional view as shown in FIG. 1.

For example, a thickness t12 of the first filling film 130 in a horizontal direction interposed between the first conductive liner 141 and the first barrier conductive film 120 on a sidewall of the first trench 115 may be less than a height t11 which is a vertical distance from the first barrier conductive film 120 on a bottom surface of the first trench 115 to a lower surface of the first conductive liner 141. For example, the thickness t12 may be a horizontal distance between the first conductive liner 141 and the first barrier conductive film 120. For example, the height t11 may be the height of the lower filling film 131 in a vertical direction as shown in FIG. 1.

According to some exemplary embodiments, an upper surface 141u of the first conductive liner 141 may be exposed by the first filling film 130. For example, the first filling film 130 may surround the first conductive liner 141 but may not overlie the upper surface 141u of the first conductive liner 140. For example, the first filling film 130 may be disposed on both sides of the first conductive liner 141, e.g., in a cross-sectional view.

Although FIG. 1 illustrates that the upper surface 130u of the first filling film is placed flush with the upper surface 141u of the first conductive liner, this is only for convenience of explanation, and exemplary embodiments are not limited thereto.

Because the first metal separating region 140 includes the second metal different from the first metal included in the first filling film 130, the first conductive liner 141 includes the second metal different from the first metal. For example, the first conductive liner 141 may include a metal different from cobalt.

For example, the first conductive liner 141 may include the second metal having a less reduction potential than cobalt. For example, a standard reduction potential of the second metal may be lower than a standard reduction potential of cobalt. For example, the first conductive liner 141 may include a metal having reduction potential less than or equal to −0.4 V and greater than or equal to −0.8 V. For example, the first conductive liner 141 may include a metal having reduction potential of −0.4 V to −0.8 V.

For example, the first conductive liner 141 may include one of cadmium (Cd), chromium (Cr), iron (Fe), and zinc (Zn). When the first conductive liner 141 includes a metal having reduction potential of −0.4 V to −0.8 V, the first conductive liner 141 may not be an alloy form with cobalt, although exemplary embodiments may not be limited thereto.

For another example, the first conductive liner 141 may include a cobalt metal alloy. For example, the first conductive liner 141 may include a metal alloy including cobalt—the first metal, and the second metal.

The second metal may include, for example, at least one of platinum (Pt), palladium (Pd), titanium (Ti), ruthenium (Ru), copper (Cu), nickel (Ni), tantalum (Ta), and tungsten (W), but not limited thereto.

For example, the second metal included in the cobalt metal alloy may be a metal capable of forming a sputtering target.

In the cobalt metal alloy, cobalt content may be greater than the other metal content.

Figure 2:
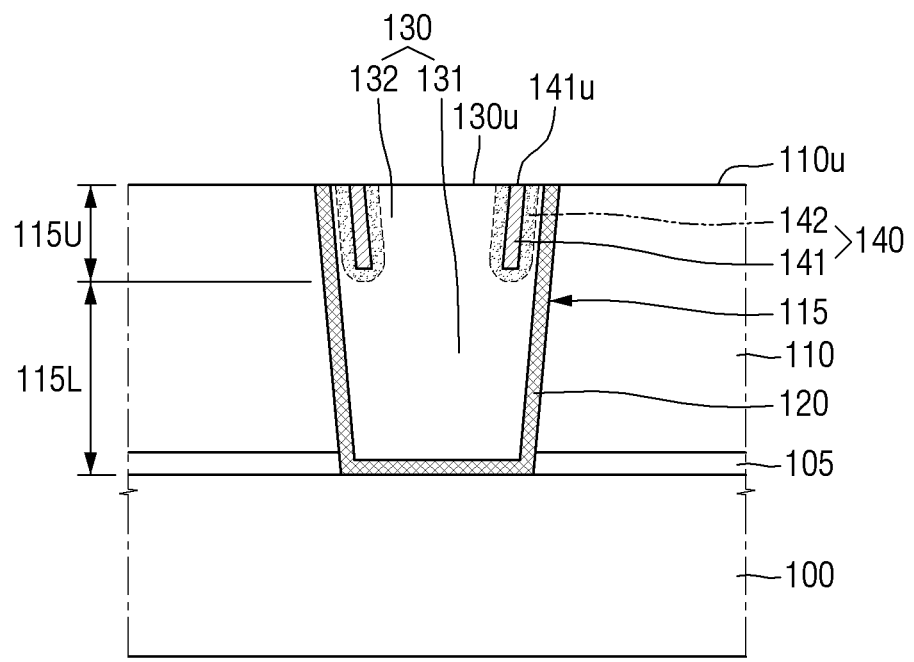
FIG. 2 is a cross-sectional view provided to explain a semiconductor device according to some exemplary embodiments of the present disclosure.

FIG. 2 is a cross-sectional vim provided to explain a semiconductor device according to some exemplary embodiments. For convenience of explanation, different features than the ones explained above with reference to FIG. 1 will be mainly explained below.

Referring to FIG. 2, in the semiconductor device according to some exemplary embodiments, the first metal separating region 140 may include the first conductive liner 141 and a metal diffusion region 142.

The metal diffusion region 142 may be formed within the first filling film 130. The metal diffusion region 142 may be formed on a periphery of the first conductive liner 141. For example, the metal diffusion region 142 may be formed in the first filling film 130 on both sides the first conductive liner 141, e.g., in a cross-sectional view.

The metal diffusion region 142 may be a region in which the second metal included in the first conductive liner 141 is diffused into the first filling film 130.

For example, when the first conductive liner 141 includes a metal having reduction potential of −0.4 V to −0.8 V the metal diffusion region 142 may be a region in which one of cadmium (Cd), chromium (Cr), iron (Fe) and zinc (Zn) is diffused into the cobalt film which is the first filling film 130.

For another example, when the first conductive liner 141 includes the cobalt metal alloy, the metal diffusion region 142 may be a region in which a metal alloyed with cobalt is diffused into the cobalt film, i.e., into the first filling film 130.

The first conductive liner 141 and the metal diffusion region 142 may be disposed within the first upper filling film 132, and may not be disposed within the first lower filling film 131. For example, when the first metal separating region 140 includes the first conductive liner 141 and the metal diffusion region 142, the first upper filling film 132 may be defined by a portion of the first filling film 130 which overlaps with the metal diffusion region 142 in a horizontal direction, and the first lower filling film 131 may be de fined by a portion of the first filling film 130 which does not overlap with the metal diffusion region 142.

Although FIG. 2 illustrates that the metal diffusion region 142 formed adjacent to one sidewall of the first trench 115 and the metal diffusion region 142 formed adjacent to the other sidewall of the first trench 115 are not connected to each other, this is only for convenience of explanation, and exemplary embodiments are not limited thereto. For example, the metal diffusion region 142 may be continuously formed from one sideman to an opposing sidewall of the barrier conductive film 120 through a center portion of the first upper filling film 132.

The first lower filing film 131 may include the second metal included in the metal diffusion region 142. However, the second metal included in the first lower filling film 131 may not result from a diffusion of the first conductive liner 141, but may be an it purity implanted during a process of forming the first lower filling film 131.

The second metal contents within the first filling film 130 and the first metal separating region 140 may be measured by soar nine, the first filling film 130 and the first metal separating region 140 with measurement equipment.

A person skilled in the an may define a boundary of the metal diffusion region 142 by comparing the second metal contents within the first filling film 130 and the first metal separating region 140. This may be because the average second metal content in the metal diffusion region 142 is higher than the average second metal content the first filling film 130. In one embodiment, the second metal content in a boundary between the metal diffusion region 142 and the first filling film 130 may be abruptly change.

Figure 3:
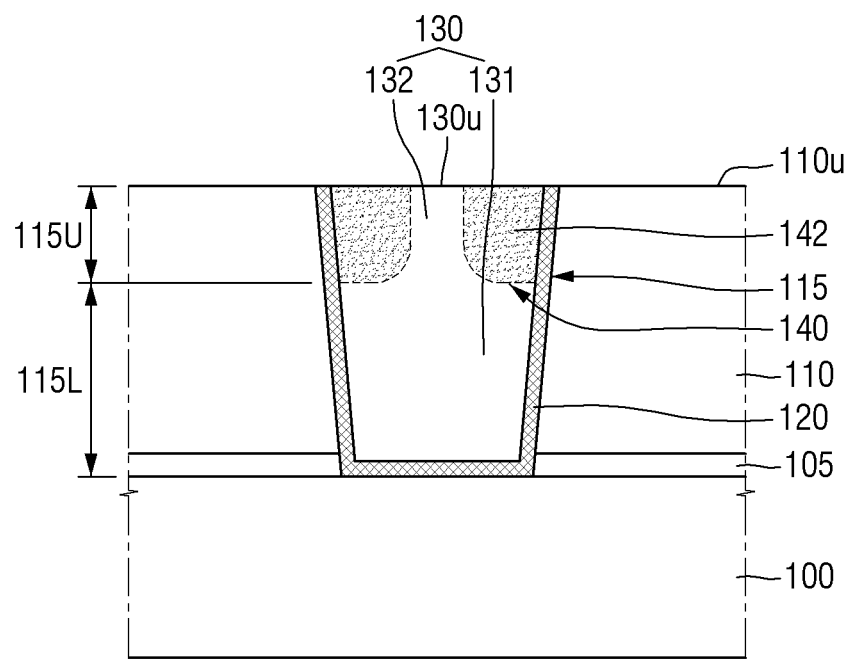
FIG. 3 is a cross-sectional view provided to explain a semiconductor device according to some exemplary embodiments of the present disclosure.

FIG. 3 is a cross-sectional view provided to explain a semiconductor device according to some exemplary embodiments. For convenience of explanation, different features than the ones explained above with reference to FIGS. 1 and 2 will be mainly explained below.

Referring to FIG. 3, in the semiconductor device according to some exemplary embodiments, the first metal separating region 140 may include the metal diffusion region 142.

The first metal separating region 140 may not include the first conductive liner 141 of FIG. 1. For example, the first conductive liner 141 may be entirely diffused into the first filling film 130 such that the first conductive liner 141 may lose shape. For example, the second metal content may smoothly change throughout the first metal separating region 140. In certain embodiments, the second metal content may be substantially the same throughout the first metal separating region 140 or throughout a substantial region of the first metal separating region 140 except an edge portion of the first metal separating region 140.

The metal diffusion region 142 may be a region in which the second metal is diffused into the first filling film 130.

In an example, when the first conductive liner 141 includes a metal having reduction potential of −0.4 V to −0.8 V, the second metal may be one of cadmium (Cd), chromium (Cr), iron (Fe), and zinc (Zn).

For example, when the first conductive liner 141 includes the cobalt metal alloy, the second metal may be a metal alloyed with cobalt.

Although FIG. 3 illustrates that the metal diffusion region 142 formed adjacent to one sidewall of the first trench 115 and the metal diffusion region 142 formed adjacent to the other sidewall of the first trench 115 are not connected to each other, this is only for convenience of explanation, and exemplary embodiments are not limited thereto. For example, the metal diffusion region 142 may be continuously formed from one sidewall to an opposing sidewall of the barrier conductive film 120 through a center portion of the first upper filling film 132.

For example, the metal diffusion region 142 may be formed on the upper portion 115U of the first trench, and the first lower filling film 131, which is the cobalt film, may be formed on the lower portion 115L of the first trench. In such case, a portion of the first upper filling film 132 may play a role of a matrix of the metal diffusion region 142, and may be included in the metal diffusion region 142. As shown in FIG. 3, when the first metal separating region 140 includes the metal diffusion region 142 without the first conductive liner 141 shown in FIGS. 1 and 2, the first upper filling film 132 may be defined by a portion of the first filling film 130 which overlaps with the metal diffusion region 142 in a horizontal direction, and the first lower filling film 131 may be defined by a portion of the first filling film 130 which does not overlap with the metal diffusion region 142.

Figure 4:
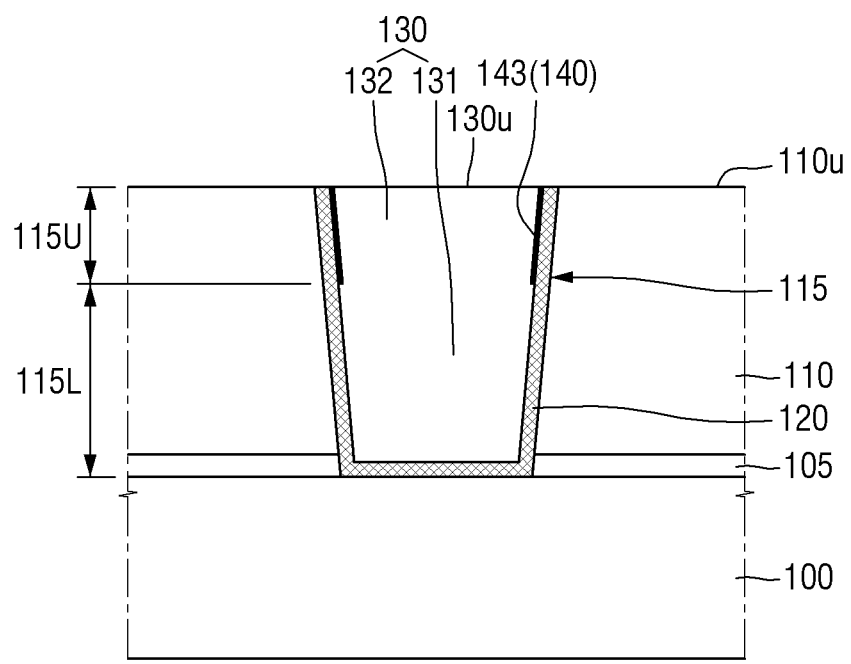
FIG. 4 is a cross-sectional view provided to explain a semiconductor device according to some exemplary embodiments of the present disclosure.

FIG. 4 is a cross-sectional view provided to explain a semiconductor device according to some exemplary embodiments. For convenience of explanation, different features than the ones explained above with reference to FIG. 1 will be mainly explained below.

Referring to FIG. 4, in the semiconductor device according to some exemplary embodiments, the first conductive liner 143 may be disposed along a boundary between the first filling film 130 and the first barrier conductive film 120. For example, the first conductive liner 143 may contact the first barrier conductive film 120.

The first metal separating region 140 may be formed along the boundary between the first filling film 130 and the first barrier conductive film 120.

The first conductive liner 143 may extend along a portion of a sidewall of the first trench 115 and/or along a portion of the first barrier conductive film 120. The first conductive liner 143 may be interposed between the first harrier conductive film 120 and the first upper filling film 132.

After the second metal within the first conductive liner 141 of FIG. 1 is diffused into the cobalt film, the first conductive liner 143 may be formed, by being piled up on the boundary between the first filling film 130 and the first barrier conductive film 120. For example, the second metal may be diffused from the first conductive liner 141 into the upper filling 130, and may be piled up to form the first conductive liner 143 on the boundary between the first filling film 130 and the first barrier conductive film 120.

For example, when the first conductive liner 141 of FIG. 1 includes a metal having reduction potential of −0.4 V to −0.8 V, the first conductive liner 143 may be a film formed of one of cadmium (Cd), chromium (Cr), iron (Fe) and zinc (Zn).

For example, when the first conductive liner 141 of FIG. 1 includes the cobalt metal alloy, the first conductive liner 143 may be a film formed of a metal alloyed with cobalt.

Figure 5:
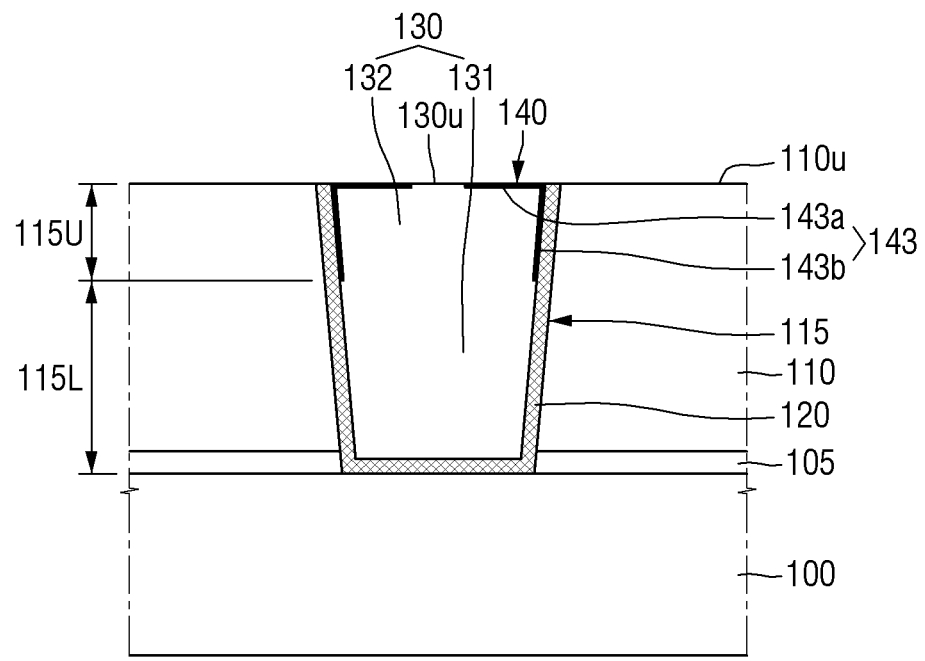
FIG. 5 is a cross-sectional view provided to explain a semiconductor device according to some exemplary embodiments of the present disclosure.

FIG. 5 is a cross-sectional view provided to explain a semiconductor device according to some exemplary embodiments. For convenience of explanation, different features than the ones explained above with reference to FIG. 4 will be mainly explained below.

Referring to FIG. 5, in the semiconductor device according to some exemplary embodiments, the first conductive liner 143 may include a portion extending along at least a portion of the upper surface 130u of the first filling film 130.

The first conductive liner 143 may include a first portion 143a extending along the upper surface 130u of the first filling film, and a second portion 143b extending along the boundary of the first filling film 130 and the first barrier conductive film 120.

Although FIG. 5 illustrates that the first portion 143a of the first conductive liner extends along a portion of the upper surface 130u of the first filling film, this is only for convenience of explanation, and exemplary embodiments are not limited thereto.

For example, in certain embodiments, the upper surface 130u of the first filling film may be entirely overlain by the first portion 143a of the first conductive liner. For example, in certain embodiments, the first portion 143a of the first conductive liner 143 may cover all the upper surface 130u of the first filling film 130.

Unlike the illustration in FIG. 5, the first conductive liner 143 may include only the first portion 143a extending along the upper surface 130u of the first filling film, and may not include the second portion 143b extending along the boundary between the first filling film 130 and the first barrier conductive film 120.

In the semiconductor device according to some exemplary embodiments of FIG. 2, a portion of the second metal included in the metal diffusion region 142 may be piled up an the boundary between the first filling film 130 and the first barrier conductive film 120, or gathered along the upper surface 130u of the first filling film, as illustrated in FIGS. 4 and 5.

Similarly, in the semiconductor device according to some exemplary embodiments of FIG. 3, a portion of the second metal included in the metal diffusion region 142 may be piled up on the boundary between the first filling film 130 and the first barrier conductive film 120, or gathered along the upper surface 130u of the first filling film.

FIGS. 4 and 5 skip illustrations of the metal diffusion region 142, but this is only for convenience of explanation, and exemplary embodiments are not limited thereto. For example, the metal diffusion region 142, in which the second metal is diffused may be present within the first filling film 130 adjacent to the first conductive liner 143. For example, a similar metal diffusion region to the one illustrated in FIGS. 2 and/or 3, may be formed in the embodiments shown in FIGS. 4 and/or 5.

Figure 6:
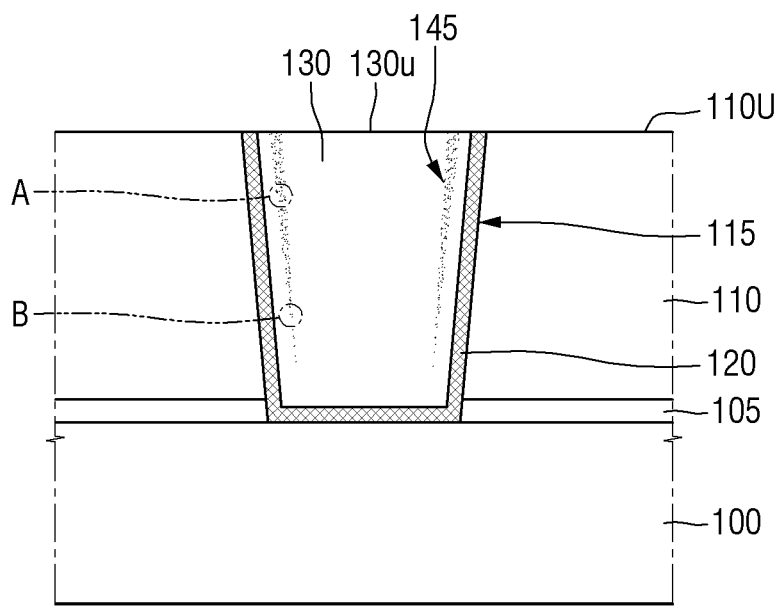
FIG. 6 is a cross-sectional view provided to explain a semiconductor device according to some exemplary embodiments of the present disclosure.
Figure 7:
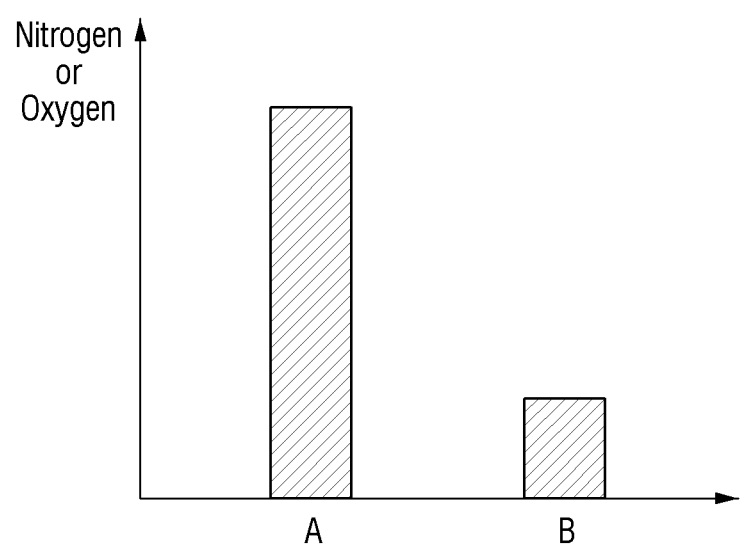
FIG. 7 is a schematic view illustrating nitrogen or oxygen content at points A and B of FIG. 6 according to an exemplary embodiment of the present disclosure.

FIG. 6 is a cross-sectional view provided to explain a semiconductor device according to some exemplary embodiments. FIG. 7 is a schematic view illustrating nitrogen or oxygen content at points A and B of FIG. 6. For convenience of explanation, different features than the ones explained above with reference to FIG. 1 will be mainly explained below.

Referring to FIGS. 6 and 7, the semiconductor device according to some exemplary embodiments may include a plasma treatment region 145 instead of the first metal separating region 140 of FIG. 1.

The plasma treatment region 145 may be formed within the first filling film 130. The plasma treatment region 145 may extend from the upper surface 130u of the first filling film 130 to a direction toward the substrate 100.

The plasma treatment region 145 may extend along a sidewall of the first trench 115. For example, the plasma treatment region 145 may extend along the first barrier conductive film 120. For example, the plasma treatment region 145 may be inclined at a similar angle to an adjacent sidewall of the trench 115 in a cross-sectional view as shown in FIG. 6. The inclined angle of the plasma treatment region 145 may be measured with respect to a center line extending in the same direction that the plasma treatment region 145 extends.

The plasma treatment region 145 may include, for example, a material in which cobalt is bonded with nitrogen or a material in which cobalt is bonded with oxygen. For example, the plasma treatment region 145 may include cobalt nitride or cobalt oxide.

In the fabrication of the first filling film 130, the plasma treatment region 145 may include different materials according to gases used for the plasma treatment. For example, when a nitration treatment is performed by using plasma, the plasma treatment region 145 may include a material in which cobalt is bonded with nitrogen. In certain embodiments when an oxidation treatment is performed by using plasma, the plasma treatment region 145 may include a material in which cobalt is bonded with oxygen.

In the semiconductor device according to some exemplary embodiments, nitrogen content or oxygen content within the plasma treatment region 145 may change as being farther away from the uppers surface 130u of the first filling film 130.

For example, nitrogen content or oxygen content within the plasma treatment region 145 may decrease as the plasma treatment region 145 extends farther away from the upper surface 130u of the first filling film 130.

In FIG. 7, oxygen or nitrogen content at point A spaced by a first distance from the upper surface 130u of the first filling film 130 is greater than oxygen or nitrogen content at point B spaced apart from the upper surface 130u of the first filling film 130 by a second distance greater than the first distance.

Although FIG. 6 illustrates that the plasma treatment region 145 is spaced apart from the first barrier conductive film 120, this is only for convenience of explanation and exemplary embodiments are not limited thereto.

For example, the plasma treatment region 145 may contact the first battier conductive film 120.

In certain embodiments, an upper region (e.g., A of FIG. 6) of the plasma treatment region 145 adjacent to the upper surface 130u of the first filling film 130 may contact the first barrier conductive film 120, and a lower region (e.g., B of FIG. 6) of the plasma treatment region 145 spaced apart from the upper surface 130u of the first filling film 130 may be spaced apart from the first harrier conducive film 120.

Plasma density at a bottom surface of the fast trench 115 may be less than a plasma density at an entry (or an upper region) of the first trench 115 in a fabrication process, and thicknesses of nitrided or oxidized cobalt of upper region and lower region of the plasma treatment region 145 may be different from each other.

Figure 8:
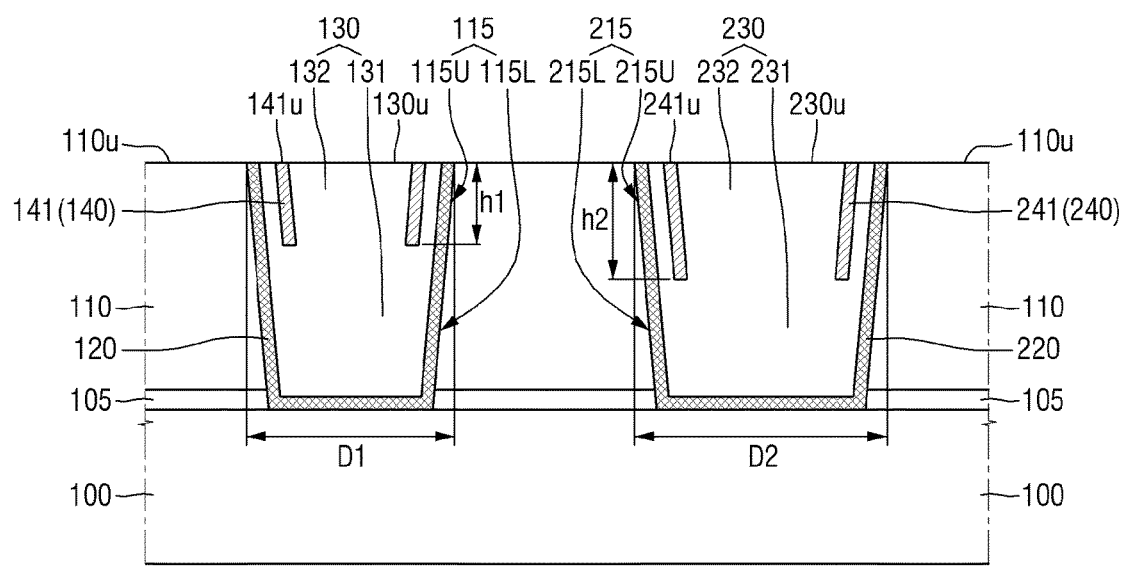
FIG. 8 is a cross-sectional view provided to explain a semiconductor device according to some exemplary embodiments of the present disclosure.

FIG. 8 is a cross-sectional view provided to explain a semiconductor device according to some exemplary embodiments. For convenience of explanation, different features than the ones explained above with reference to FIG. 1 will be mainly explained below.

Referring to FIG. 8, the semiconductor device according to some exemplary embodiments may additionally include a second harder conductive film 220, a second filling film 230, and a second metal separating region 240.

The interlayer insulating film 110 may include the first trench 115 and a second trench 215. Although FIG. 8 illustrates the first trench 115 and the second trench 215 without being intervened by additional trenches therebetween, this is only for convenience of explanation and exemplary embodiments are not limited thereto.

The second trench 215 may include an upper portion 215U and a lower portion 215L. The upper portion 215U of the second trench and the lower portion 215L of the second trench ma be defined by a lower surface of the second metal separating region 240, which will be described below.

The second barrier conductive film 220 may be formed along a sidewall and a bottom surface of the second trench 215. The second barrier conductive film 220 and the first barrier conductive film 120 may be formed by the same fabricating process. For example, the second barrier conductive film 220 may be formed at a same level as the first barrier conductive film 120.

The second filling film 230 may be formed within the second trench 215. For example, the second filling film 230 may fill the second trench 215. The second filling film 230 may fill the upper portion 215U of the second trench and the lower portion 215L of the second trench. The second filling film 230 may be formed on the second barrier conductive film 220. The second filling film 230 may be electrically connected to a conductive pattern that may be included in the substrate 100.

The second filling film 230 may include the first metal as the first filling film 130. For example, the second filling film 230 may be a conductive film including cobalt. The second filling film 230 may be formed by the same fabricating process as the first filling film 130. For example, the second filling film 230 may be formed at a same level as the first filling film 130.

The second filling film 230 may include a second lower filling film 231 filling the lower portion 215L of the second trench, and a second upper filling film 232 filling the upper portion 215U of the second trench. The second lower filling, film 231 and the second upper filling film 232 may be defined by a lower surface of the second metal separating region 240, which will be described below.

The second metal separating region 240 may be formed within the second filling film 230. The second metal separating region 240 may be formed on the second barrier conductive film 220. For example, the second metal separating region 240 may be spaced apart from the second harrier conductive film 220, or the second metal separating region 240 may contact the second barrier conductive film 220.

The second metal separating region 240 may include the second metal which may be the same material as the second metal of the first metal separating region 140. The second metal separating region 240 may be formed by the same fabrication process as the first metal separating region 140. For example, the second metal separating region 240 may be formed at a same level as the first metal separating region 140.

The second metal separating region 240 may include a second conductive liner 241. For example, the second metal separating region 240 may have a bar-like shape elongated in one direction, e.g., in a cross-sectional view as shown in FIG. 8.

The second conductive liner 241 may extend along a portion of a sidewall of the second trench 215. For example, the second conductive liner 241 may extend along a sidewall of the upper portion 215U of the second trench, and may not extend along a sidewall of the lower portion 215L of the second trench.

The second conductive liner 241 may be formed along the second barrier conductive film 220 which is formed on a sidewall of the second trench 215. The second conductive liner 241 may be formed on the second barrier conductive film 220 which is formed on a sidewall of the second trench 215. For example, the second conductive liner 241 may be spaced apart from the second barrier conductive film 220, or the second conductive liner 241 may contact the second barrier conductive film 220.

In the semiconductor device according to some exemplary embodiments, the upper surface 141u of the first conductive liner may be exposed by the first filling film 130, and an upper surface 241u of the second conductive liner may be exposed by the second filling film 230.

For example, the first filling film 130 and the second filling film 230 may respectively surround the first conductive liner 141 and the second conductive liner 241, but may not overlie the upper surface 141u of the first conductive liner and the upper surface 241u of the second conductive liner. For example, the first filling film 130 may be disposed on both sides of the first conductive liner 141, and the second filling film 230 may be disposed on both sides of the second conductive liner 241, e.g., in a cross-sectional view.

A width D1 of the first trench 115 may be different from a width D2 of the second trench 215. In an example, the widths of the first and second trenches 115, 215 may be defined based on the upper surface 110u of the interlayer insulating film 110.

A distance h1 from the upper surface 110u of the interlayer insulating film 110 to a lower surface of the first conductive liner 141 (or to the first metal separating region 140) may be different from a distance h2 from the upper surface 110u of the interlayer insulating film 110 to a lower surface of the second conductive liner 241 (or to the second metal separating region 240). For example, the heights of the first and second conductive liners 141 and 241 (or the heights of the first and second metal separating regions 140 and 240) may be different from each other. The heights of the first and second conductive liners 141 and 241 may refer to respective vertical distances between the upper surfaces (141u and 241u) and the bottom surfaces of the first and second conductive liners 141 and 241.

In the semiconductor device according to some exemplary embodiments, the width D1 of the first trench 115 may be less than the width D2 of the second trench 215. Further, the distance h1 from the upper surface 110u of the interlayer insulating film 110 to the lower surface of the first conductive liner 141 may be less than the distance h2 from the upper surface 110u of the interlayer insulating film 110 to the lower surface of the second conductive liner 241.

However, although a height h2 of the second conductive liner 241 is greater than a height h1 of the first conductive liner 141, the second conductive liner 241 may extend along a portion of the sidewall of the second trench 215. For example, the second conductive liner 241 may not contact the second barrier conductive film 220 on the bottom surface of the second trench 215.

Although FIG. 8 illustrates that the first and second metal separating regions 140, 240 respectively include the first conductive liner 141 and the second conductive liner 241, exemplary embodiments may not be limited thereto.

For example, each of the first and second metal separating regions 140, 240 may have the configurations described with reference to FIGS. 2 to 5. For example, the first and second metal separating regions 140 and 240 may have different heights from each other and may include respective metal diffusion regions.

Unlike the illustration in FIG. 8, in the semiconductor device according to some exemplary embodiments, the plasma treatment region of FIG. 6 may be formed within the first and second filling films 130, 230.

Hereinbelow, a method for fabricating a semiconductor device according to some exemplary embodiments will be described with reference to FIGS. 1 and 9 to 13.

FIGS. 9 to 13 are cross-sectional views illustrating, intermediate stages of fabrication, provided to explain a fabricating method of a semiconductor device according to some exemplary embodiments.

Figure 9:
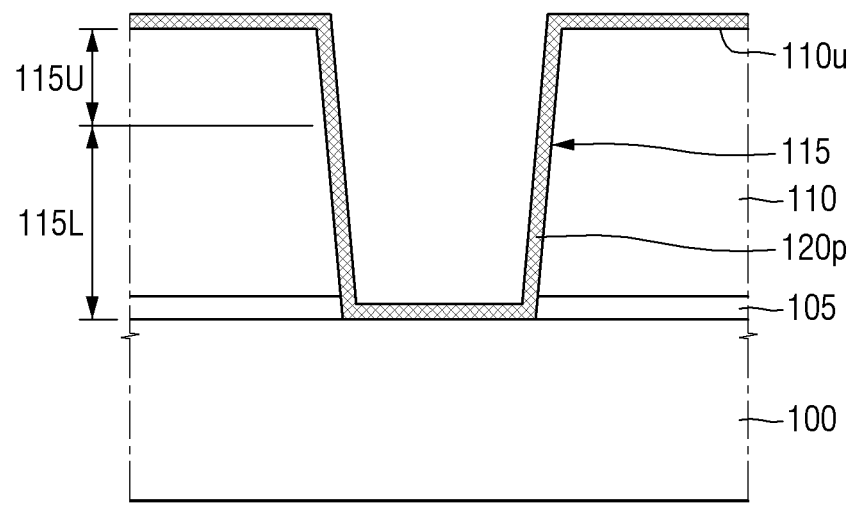
FIGS. 9 to 13 are cross-sectional views illustrating intermediate stages of fabrication, provided to explain a fabricating method of a semiconductor device according to some exemplary embodiments of the present disclosure.

Referring to FIG. 9, the etch stopping film 105 and the interlayer insulating film 110 may be sequentially formed on the substrate 100.

The etch stopping film 105 may be formed by using, for example, chemical vapor deposition (CVD), and so on.

The interlayer insulating film 110 may be formed by using, for example, chemical vapor deposition (CVD), spin coating, plasma enhanced CVD (PECVD), high density plasma CVD (HDP-CVD), and so on.

Next, the first trench 115 may be formed within the interlayer insulating film 110 and the etch stopping film 105 by etching the interlayer insulating film 110 and the etch stopping film 105 with a mask pattern, and so on. As a result, the interlayer insulating film 110 including the first trench 115 may be formed on the substrate 100.

The first trench 115 may include the upper portion 115U of the first trench and the lower portion 115L of the first trench.

Then, a pre-barrier conductive film 120p may be formed along a sidewall and a bottom surface of the first trench 115, and along the upper surface 110u of the interlayer insulating film 110.

The pre-barrier conductive film 120p may, include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN) vanadium (V), vanadium nitride (VN), niobium (Nb), niobium nitride (NbN), and a combination thereof.

The pre-barrier conductive film 120p may be formed by using, for example, physical vapor deposition (PVD), sputtering, chemical vapor deposition (CVD), atomic layer deposition (ALD), and so on, although exemplary embodiments may not be limited thereto.

Figure 10:
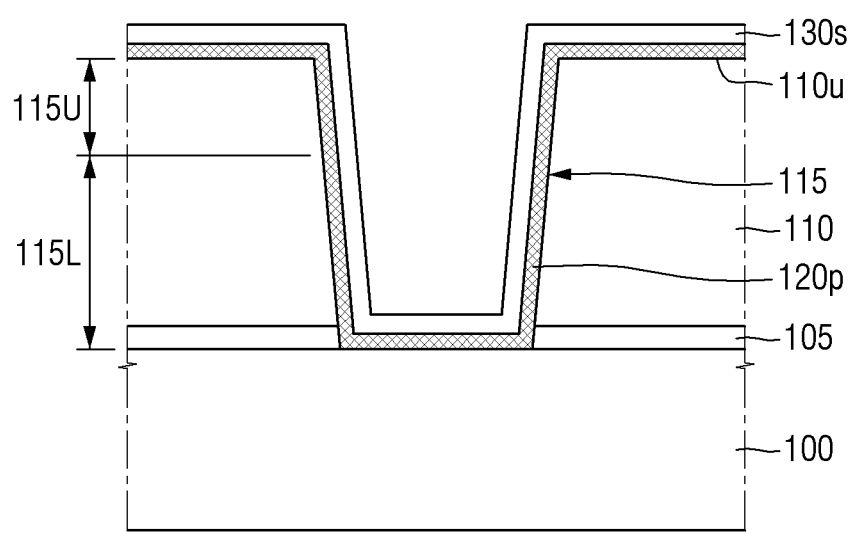

Referring to FIG. 10, a filling seed film 130s may be formed on the pre-barrier conductive film 120p.

The filling seed film 130s may be formed along a sidewall and a bottom surface of the first trench 115, and along the upper surface 110Ii of the interlayer insulating film 110. The filling seed film 130s may be formed along a profile of the pre-barrier conductive film 120p.

For example, the filling seed film 130s may include cobalt. In a method for fabricating a semiconductor device according to some exemplary embodiments, the filling seed film 130s may be a cobalt seed film.

The filling seed film 130s may be formed by using, for example, physical vapor deposition (PVD) or chemical vapor deposition (CVD). Alternatively, the filling seed film 130s may be formed by using physical vapor deposition (PVD) and chemical vapor deposition (CVD).

Figure 11:
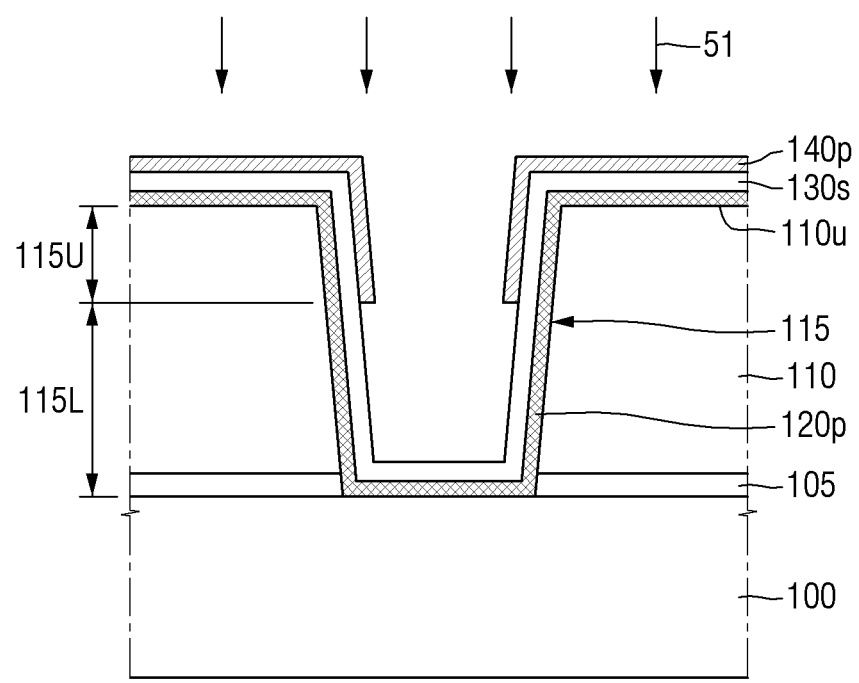

Referring to FIG. 11, a surface treatment may be performed on the filling seed film 130s disposed on the sidewall of the upper portion 115U of the first trench and the upper surface 110u of the interlayer in dating film with a first surface treatment process 51.

The first surface treatment process 51 may include forming a plating resist metal film 140p On the filling, seed film 130s disposed on the sidewall of the upper portion 115U of the first trench and the upper surface 110u of the interlayer insulating film.

For example, the plating resist metal film 140p may overlie the filling seed film 130s on the sidewall of the upper portion 115U of the first trench and the upper surface 110u of the interlayer insulating film.

The plating resist metal film 140p may expose the filling seed film 130s on the sidewall and the bottom surface of the lower portion 115L of the first trench.

The first surface treatment process 51 may deposit the plating resist metal film 140p on the filling seed film 130s by using for example, physical vapor deposition (PVD).

For example, the plating resist metal film 140p may include the second metal having a lower reduction potential than cobalt. The plating resist metal film 14 may include a metal having reduction potential of −0.4 V to −0.8 V. For example, the plating resist metal film 140p may include one of cadmium (Cd), chromium (Cr), iron (Fe), and zinc (Zn).

For another example, the plating resist metal film 140p may include a cobalt metal alloy. For example, the plating resist metal film 140p may include a metal alloy including cobalt as the first metal, and the second metal different from the first metal.

The second metal may include, for example, at least one of platinum (Pt), palladium (Pd), titanium (Ti), ruthenium (Ru), copper (Cu), nickel (Ni), tantalum (Ta), and tungsten (W), but it may not be limited thereto.

Figure 12:
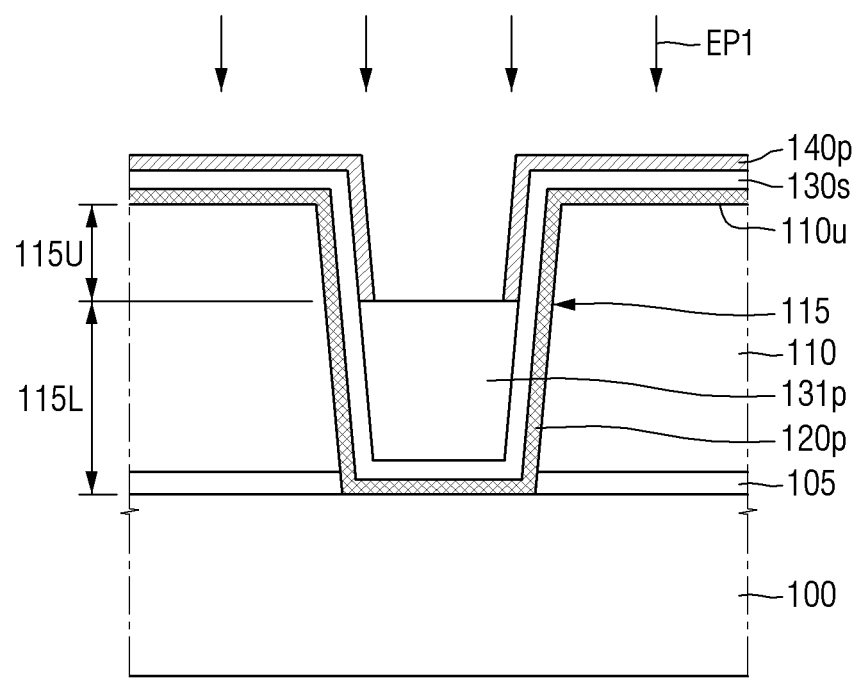

Referring to FIG. 12, a pre-lower filling film 131p filling the lower portion 115L of the first trench may be formed by using a first electroplating method (EP1) after the first surface treatment process 51.

The first electroplating method (EP1) may be a plating method for forming the cobalt film. For example, the pre-lower filling film 131p may include cobalt.

In a method for fabricating a semiconductor device according to exemplary embodiments, the pre-lower filling film 131p may be the cobalt film.

For example, when the plating resist metal film 140p includes a metal having reduction potential of −0.4 V to −0.8 V, the plating resist metal film 140p may have a lower reduction potential than cobalt. As a result, while the pre-lower filling film 131p is formed with the first electroplating method (EP1), nucleation of the cobalt film may be suppressed on the plating resist metal film 140p.

Accordingly, the pre-lower filling film 131p may be formed on the filling seed film 130s exposed by the plating resist metal film 140p and disposed on the lower portion 115L of the first trench.

For another example, when the plating resist metal film 140p includes the cobalt metal alloy, the plating resist metal film 140p may have a greater resistance than that of the filling seed film 130s which may be the cobalt seed film. For example, while the pre-lower filling film 131p is formed with the first electroplating method (EP1), the electric current flowing the plating resist metal film 140p may be lower than that flowing the filling seed film 130s.

For example, while the pre lower filling film 131p is formed with the first electroplating method (EP1), nucleation of the cobalt film may be suppressed on the plating resist metal film 140p.

Accordingly, the pre-lower filling film 131p may be formed on the lower portion 115L of the first trench exposed by the filling seed film 130s.

Figure 13:
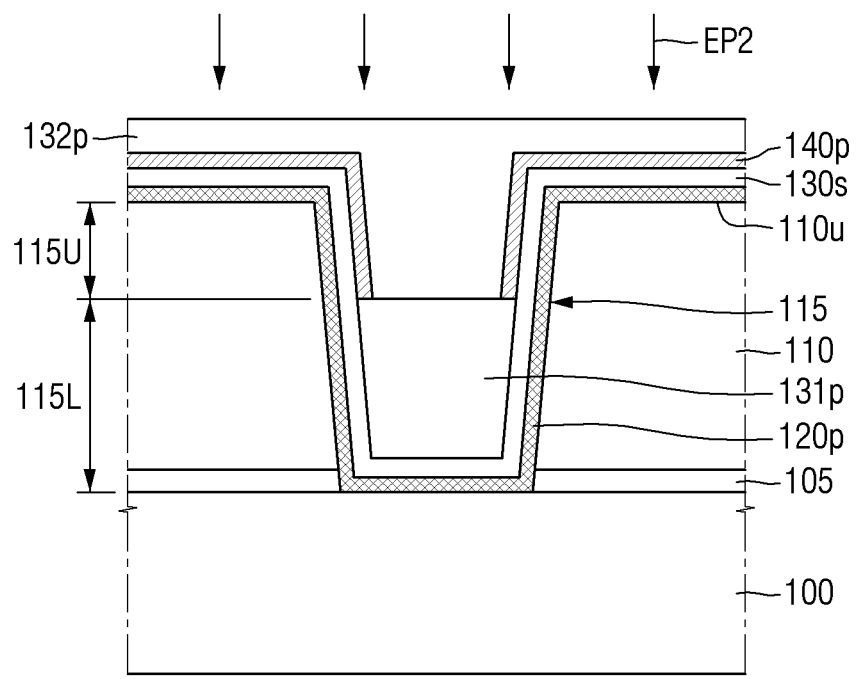

Referring to FIG. 13, a pre-upper filling film 132p may be formed on the pre-lower filling film 131p by using a second electroplating method (EP2).

The pre-upper filling film 132p may fill the upper portion 115I of the first trench. For example, the pre-upper filling film 132p may be formed on the plating resist metal film 140p.

The second electroplating method (EP2) may be a plating method for forming the cobalt film. For example, the pre-upper filling film 132p may include cobalt.

In a method for fabricating a semiconductor device according to, some exemplary embodiments, the pre-upper filling film 132p may be the cobalt film.

The second electroplating method (EP2) forming the pre-upper filling film 132p may be different from the first electroplating method (EP1) forming the pre-lower filling film 131p. For example, the magnitude of the current used in the second electroplating method (EP2) may be different from the magnitude of the current used in the first electroplating method (EP1).

In a method for fabricating a semiconductor device according to some exemplary embodiments, the magnitude of the electric current used in the second electroplating method (EP2) may be greater than that of the current used in the first electroplating method (EP1).

For example, the second electroplating method (EP2) may be a plating method forming the cobalt film by applying a first current, while the first electroplating method (EP1) is a plating method forming the cobalt film by applying a second current lower than the first current.

Because the second electroplating method (EP2) uses the current higher than that of the first electroplating method (EP1), nucleus of the cobalt film may be generated on the plating resist metal film 140p. As a result, the cobalt film may be formed on the plating resist metal film 140p.

Referring to FIG. 1, the pre-upper filling film 132p formed on the upper surface of the interlayer insulating film 110, the plating resist metal film 140p, the filling seed film 130s, and the pre-barrier conductive film 120p may be removed from the upper surface 110u of the interlayer insulating film 110. The upper surface 110u of the interlayer insulating film 110 may be exposed.

As a result, the first barrier conductive film 120, the first filling film 130, and the first metal separating region 140 may be formed. For example, a portion of the plating resist metal film 140p may become the first metal separating region 140. The first lower filling film 131 may include the filling seed film 130s and the pre-lower filling film 131p on the sidewall and the bottom surface of the lower portion 115L of the first trench. The first upper filling film 132 may include the pre-upper filling film 132p within the upper portion 115U of the first trench, and the filling seed film 130s on the sidewall of the upper portion 115U of the first trench.

After forming the first filling film 130, additional semiconductor device fabrication processes may be performed. Heat budget for the additional semiconductor device fabrication processes may change a configuration of the first metal separating region 140.

For example, when the first metal separating region 140 is not influenced by the heat budget, the first metal separating region 140 may remain in the configuration of the first conductive liner 141.

A shape of the first metal separating region 140 may become different as described in FIGS. 2 to 5 according to how much the heat budget influences the first metal separating region 140, and based on the phase diagram between the second metal and cobalt included in the first metal separating region 140.

Figure 14:
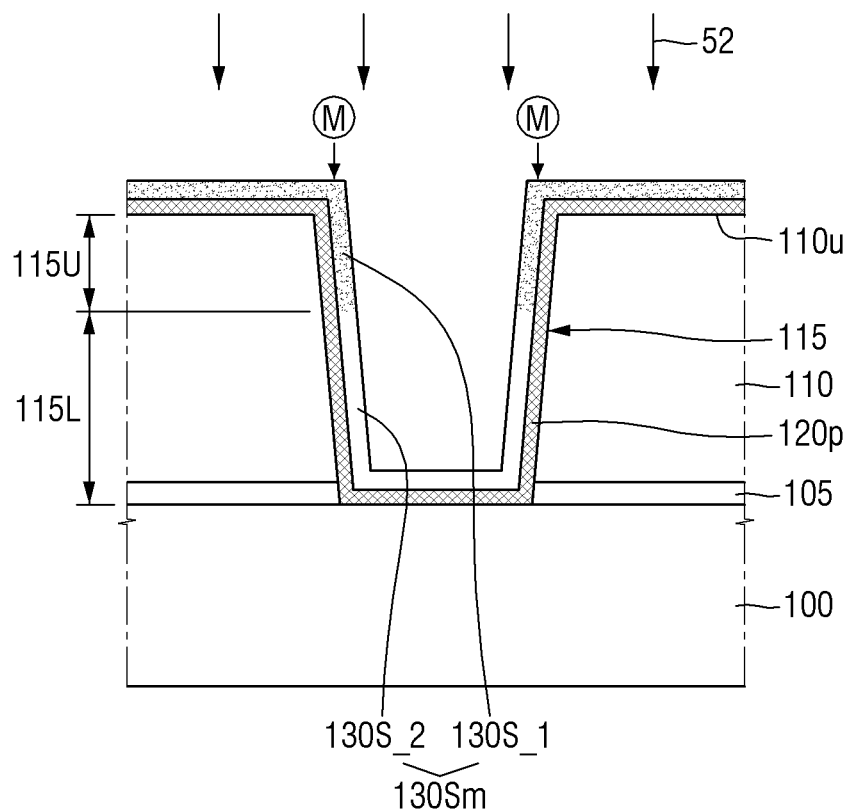
FIG. 14 is a cross-sectional view illustrating an intermediate stage of fabrication, provided to explain a fabricating method of a semiconductor device according to some exemplary embodiments of the present disclosure.

FIG. 14 is a cross-sectional view illustrating intermediate stage of fabrication, provided to explain a fabricating method of a semiconductor device according to some exemplary embodiments.

FIG. 14 may be a stage of process performed after the stage of FIG. 10. For example, the stages illustrated in FIGS. 12 and 13 may follow the stage of FIG. 14.

Referring to FIG. 14, a surface treatment may be performed on the filling seed film 130s on the sidewall of the upper portion 115u of the first trench and the upper surface 110u of the interlayer insulating film 110 by using a second surface treatment process 52.

The second surface treatment process 52 may include implanting a resistance change metal on the filling seed film 130s on the sidewall of the upper portion 115U of the first trench and on the upper surface 110u of the interlayer insulating film 110.

For example, the resistance change metal ma include, for example a metal having reduction potential of −0.4 V to −0.8 V. The resistance change metal ma include for example, one of cadmium (Cd), chromium (Cr), iron (Fe), and zinc (Zn).

For another example, the resistance change metal may include a metal that may form a metal alloy with cobalt. The resistance change metal may include at least one of, for example, platinum (Pt), palladium (Pd), titanium (Ti), ruthenium (Ru), copper ((nickel (Ni), tantalum (Ta), and tungsten (W), but exemplary embodiments are not limited thereto.

Through the second surface treatment process 52 a metal implanted seed film 130Sm may be formed on the pre-barrier conductive film 120p. The metal implanted seed film 130Sm may include a first portion 130S_1 implanted with the resistance change metal, and a second portion 130S_2 not implanted with the resistance change metal.

The first portion 130S_1 of the metal implanted seed film may be formed on the sidewall of the upper portion 115U of the first trench and the upper surface 110u of the interlayer insulating film 110. The second portion 130S_2 of the metal implanted seed film may be formed on the sidewall and the bottom surface of the lower portion 115L of the first trench.

For example, the second portion 130S_2 of the metal implanted seed film may be a film to which no resistance change metal is implanted, although exemplary embodiments may not be limited thereto. For example, the second portion 130S_2 of the metal implanted seed film may include the implanted resistance change metal. In certain embodiments, the second portion 130S_2 of the metal implanted seed film 130Sm may include less density of the implanted resistance change metal than the first portion 130S_1 of the metal implanted seed film 130Sm.

Figure 15:
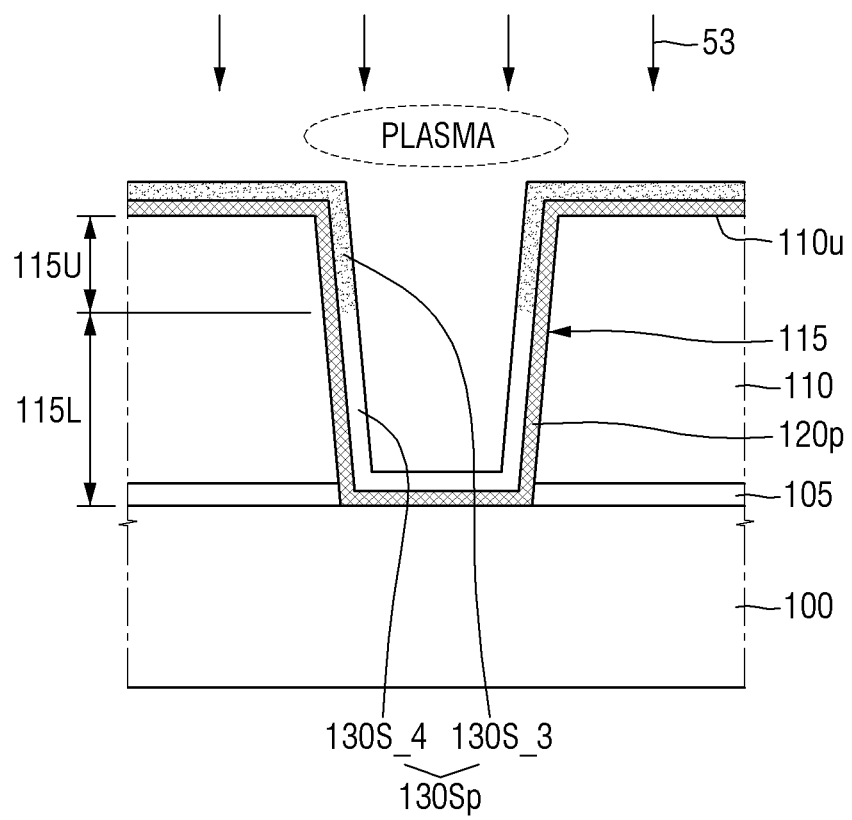
FIG. 15 is a cross-sectional view illustrating an intermediate stage of fabrication, provided to explain a fabricating method of a semiconductor device according to some exemplary embodiments of the present disclosure.

FIG. 15 is a cross-sectional view illustrating intermediate stage of fabrication, provided to explain a fabricating method of a semiconductor device according to some exemplary embodiments.

FIG. 15 may illustrate a stage of process performed after the stage of FIG. 10. For example, the stages illustrated in FIGS. 12 and 13 may follow the stage of FIG. 15.

Referring to FIG. 15, a surface treatment may be performed on the filling seed film 130s on the sidewall of the upper portion 115U of the first trench and the upper surface 110u of the interlayer insulating film 110 by using a third surface treatment process 53.

The third surface treatment process 53 may include changing the filling seed film 130s on the sidewall of the upper portion 115U of the first trench and the upper surface 110u of the interlayer insulating film by using plasma.

For example, the third surface treatment process 53 may nitride or oxidize the filling seed film 130s on the sidewall of the upper portion 115U of the first trench and the upper surface 110u of the interlayer insulating film by using plasma.

Through the third surface treatment process 53, a plasma treated seed film 130Sp may be formed on the pre-barrier conductive film 120p. The plasma treated seed film 130Sp may include a first portion 130S_3, which is the nitrided or oxidized filling seed film 130s, and a second portion 130S_4, which is not treated with plasma.

The first portion 130S_3 of the plasma treated seed film may be formed on the sidewall of the upper portion 115U of the first trench and the upper surface 110u of the interlayer insulating film. The second portion 130S_4 of the plasma treated seed film may be formed on the sidewall and the bottom surface of the lower portion 115L of the first trench.

Density of plasma may lint be zero at the bottom surface of the first trench 115. Accordingly, the second portion 130S_4 of the plasma treated seed film may also be partially nitrided or oxidized. For example, in certain embodiments, the nitration or the oxidation of the filling seed film 130s may gradually change from the first portion 130S_3 to the second portion 130S_4. For example, the first portion 130S_3 of the plasma treated seed film may be a rich nitride (or oxide) region, and the second portion 130S_4 of the plasma treated seed film may be a scarcely nitrided (oxided) region.

After performing the stages of FIGS. 12 and 13, the first filling film 130 and the plasma treatment region 145, which are described with reference to FIGS. 6 and 7, may be formed.

While the present disclosure has been shown and described with reference to exemplary embodiments thereof, it will be apparent to those of ordinary skill in the art that various modifications in form and details may be made thereto without mat daily departing from the spirit and scope of the present disclosure as defined by the following claims.

What is claimed is:
1. A semiconductor device comprising:
an interlayer insulating film on a substrate, the interlayer insulating film comprising an opening;
a barrier conductive film extending along a sidewall of the opening and a bottom surface exposed by the opening;
a first film disposed on the barrier conductive film and in the opening, the first film comprising cobalt; and
a conductive liner on the barrier conductive film, the conductive liner extending along a portion of a sidewall of the opening and comprising a first metal other than cobalt,
wherein the first film comprises a first portion filling a lower portion of the opening and a second portion filling an upper portion of the opening, and
wherein the first portion of the first film is directly adjacent to the second portion of the first film which is disposed between two portions of the conductive liner.

2. The semiconductor device of claim 1, wherein a portion of the first film is interposed between the conductive liner and the barrier conductive film on the sidewall of the opening.

3. The semiconductor device of claim 2, wherein the conductive liner comprises a metal alloy comprising cobalt and the first metal.

4. The semiconductor device of claim 2, wherein the first metal comprises one of cadmium (Cd), chromium (Cr), iron (Fe), and zinc (Zn).

5. The semiconductor device of claim 2, wherein an upper surface of the conductive liner is exposed by the first film.

6. The semiconductor device of claim 2, wherein a thickness of the first film interposed between the conductive liner and the barrier conductive film on the sidewall of the opening is less than a height from the barrier conductive film on the bottom surface exposed by the opening to a lower surface of the conductive liner,
    wherein the thickness of the first film interposed between the conductive liner and the barrier conductive film is a horizontal distance between the conductive liner and the barrier conductive film, and the height is a vertical distance between the barrier conductive film on the bottom surface exposed by the opening and a lower surface of the conductive liner.

7. The semiconductor device of claim 1, wherein the conductive liner is disposed along a boundary between the first film and the barrier conductive film.

8. The semiconductor device of claim 7, wherein the conductive liner extends along at least a portion of an upper surface of the first film.

9. The semiconductor device of claim 1, further comprising a metal diffusion region within the first film, the metal diffusion region having the first metal diffused therein,
    wherein the metal diffusion region is disposed on a periphery of the conductive liner.

10. The semiconductor device of claim 1, wherein the opening forms a trench.

11. A semiconductor device, comprising:
    an interlayer insulating film on a substrate, the interlayer insulating film comprising an opening, wherein the opening comprises a lower portion and an upper portion;
    a filling film comprising a first portion filling the lower portion of the opening and a second portion filling the upper portion of the opening, wherein the filling film comprises cobalt; and
    a metal separating region within the filling film, the metal separating region comprising a first metal other than cobalt,
    wherein the metal separating region is disposed in the second portion of the filling film and is not disposed in the first portion of the filling film, and
    wherein the first portion of the filling film is directly adjacent to the second portion of the filling film which is disposed between two portions of the metal separating region.

12. The semiconductor device of claim 11, wherein the metal separating region extends along a sidewall of the opening, and comprises a conductive liner formed of the first metal, and the first metal is an element having a lower standard reduction potential than cobalt.

13. The semiconductor device of claim 12, wherein the first metal comprises one of cadmium (Cd), chromium (Cr), iron (Fe), and zinc (Zn).

14. The semiconductor device of claim 11, wherein the metal separating region comprises a conductive liner extending along a sidewall of the opening, and
    the conductive liner comprises a metal alloy comprising cobalt and the first metal.

15. The semiconductor device of claim 14, wherein the metal separating region further comprises a metal diffusion region formed on a periphery of the conductive liner, and
    the metal diffusion region is a region in which the first metal is diffused into the filling film.

16. The semiconductor device of claim 11, wherein the metal separating region comprises a metal diffusion region in which the first metal is diffused into the filling film.

17. The semiconductor device of claim 11, further comprising a barrier conductive film extending along a sidewall of the opening and a bottom surface exposed by the opening, wherein the filling film is formed on the barrier conductive film.

18. A semiconductor device, comprising:
    an interlayer insulating film on a substrate, the interlayer insulating film comprising a first opening and a second opening having different widths from each other;
    a first filling film filling the first opening and comprising a first metal, wherein the first metal is cobalt;
    a second filling film filling the second opening and comprising the first metal;
    a first conductive liner within the first filling film, the first conductive liner comprising a second metal different from the first metal; and
    a second conductive liner within the second filling film, the second conductive liner comprising the second metal,
    wherein a vertical distance from an upper surface of the interlayer insulating film to a lower surface of the first conductive liner is different from a vertical distance from an upper surface of the interlayer insulating film to a lower surface of the second conductive liner.

19. The semiconductor device of claim 18, wherein a width of the first opening is greater than a width of the second opening, and
    a vertical distance from the upper surface of the interlayer insulating film to the lower surface of the first conductive liner is greater than a vertical distance from the upper surface of the interlayer insulating film to the lower surface of the second conductive liner.

20. The semiconductor device of claim 19, wherein the first conductive liner extends along a portion of a sidewall of the first opening.

21. The semiconductor device of claim 18, wherein an upper surface of the first conductive liner is exposed by the first filling film, and an upper surface of the second conductive liner is exposed by the second filling film.

* * * * *